United States Patent [19]

Kurisu

[11] Patent Number: 5,194,932
[45] Date of Patent: Mar. 16, 1993

[54] SEMICONDUCTOR INTEGRATED CIRCUIT DEVICE

[75] Inventor: Masakazu Kurisu, Tokyo, Japan
[73] Assignee: NEC Corporation, Tokyo, Japan
[21] Appl. No.: 706,659
[22] Filed: May 29, 1991
[30] Foreign Application Priority Data May 30, 1990 [JP] Japan ............................. 2-140431

[51] Int. Cl.$^5$ ................ H01L 27/04; G01R 1/06; H01P 3/08
[52] U.S. Cl. ................. 257/773; 324/158 P; 257/701; 257/750
[58] Field of Search ............... 357/74, 68, 80, 65

[56] References Cited

U.S. PATENT DOCUMENTS

| | | | |
|---|---|---|---|
| 4,267,633 | 5/1981 | Seiler | 357/68 |
| 4,683,384 | 7/1987 | Shibata et al. | 307/475 |
| 4,764,723 | 8/1988 | Strid | 324/158 P |
| 4,926,234 | 5/1990 | Katoh | 357/80 |

FOREIGN PATENT DOCUMENTS 61-100955 5/1986 Japan .

Primary Examiner—Eugene R. LaRoche
Assistant Examiner—Viet Q. Nguyen

[57] ABSTRACT

A semiconductor integrated circuit device includes an internal circuit, input and output signal pads, a power source pad and a plurality of ground pads, a ground pattern, and a power source pattern. The internal circuit is formed in a predetermined region of a semiconductor substrate. The input and output signal pads are arranged on a semiconductor substrate surface and connected to the internal circuit. The power source pad and the plurality of ground pads are arranged on the semiconductor substrate surface and supply a power source to the internal circuit. The ground pattern is arranged in a region of the surface of the semiconductor substrate different from the region in which the internal circuit is formed, and the ground pattern connects the plurality of ground pads to each other. The power source pattern is formed below the ground pattern through an insulating interlayer and connected to the power source pad. The ground pattern, the insulating interlayer, and the power source pattern are cooperated to form an MIM type capacitor.

8 Claims, 4 Drawing Sheets

SEMICONDUCTOR INTEGRATED CIRCUIT DEVICE

BACKGROUND OF THE INVENTION

The present invention relates to an RF semiconductor integrated circuit device.

A chip layout of a conventional RF semiconductor integrated circuit device is shown in FIG. 4a. Referring to FIG. 4a, reference numeral 1 denotes a semiconductor substrate; 2, an internal circuit; 3, an input signal pad; 4, an output signal pad; 5, 7, and 9, ground pads; 10, a power source pad; and 11, a ground pattern. When a characteristic test is to be performed to this semiconductor integrated circuit device, as shown in FIG. 4b, probe electrodes 21 and 22 arranged on an RF probe 20, probe electrodes 31 and 32 arranged on an RF probe 30, and DC probes 40 and 50 are brought into contact with the above corresponding pads, and the semiconductor integrated circuit is turned on. In this case, the input signal pad 3 and the ground pad 5 constitute a balanced input pad array, and the output signal pad 4 and the ground pad 7 constitute a balanced output pad array. These input and output pad arrays are connected to an RF measure pad through the RF probes 20 and 30, and the power source 10 and the ground pad 9 are connected to a power source through the DC proves 40 and 50. Thus, RF characteristic and DC characteristic of the internal circuit 2 are measured in a wafer state.

In the above conventional semiconductor integrated circuit device, in order to RF-ground a power source, a chip capacitor and the like are inserted between a power source line and a ground line on a probe card (not shown) having a probe. For this reason, the power source cannot be sufficiently RF-grounded, resulting in inconvenience in measurement of the RF characteristic of the circuit in a wafer state.

SUMMARY OF THE INVENTION

It is an object of the present invention to provide a semiconductor integrated circuit device in which the RF characteristic of an internal circuit can be precisely measured in a wafer state.

It is another object of the present invention to provide a semiconductor integrated circuit device in which a power source is reliably RF-grounded.

It is still another object of the present invention to provide a semiconductor integrated circuit device which does not require a special-purpose RF ground circuit for performing a characteristic test.

According to the present invention, there is provided a semiconductor integrated circuit device comprising an internal circuit formed in a predetermined region of a semiconductor substrate, input and output signal pads arranged on a semiconductor substrate surface and connected to the internal circuit, a power source pad and a plurality of ground pads, arranged on the semiconductor substrate surface, for supplying a power source to the internal circuit, a ground pattern, arranged in a region of the surface of the semiconductor substrate different from the region in which the internal circuit is formed, for connecting the plurality of ground pads to each other, and a power source pattern formed below the ground pattern through an insulating interlayer and connected to the power source pad, whereby forming an MIM type capacitor by cooperating with the ground pattern, the insulating interlayer, and the power source pattern.

According to the present invention, since a power source pad is RF-grounded by an MIM type capacitor, capacitor means is not required on probe card.

DESCRIPTION OF THE PREFERRED EMBODIMENTS

The present invention will be described below with reference to the accompanying drawings.

Figure 1A:
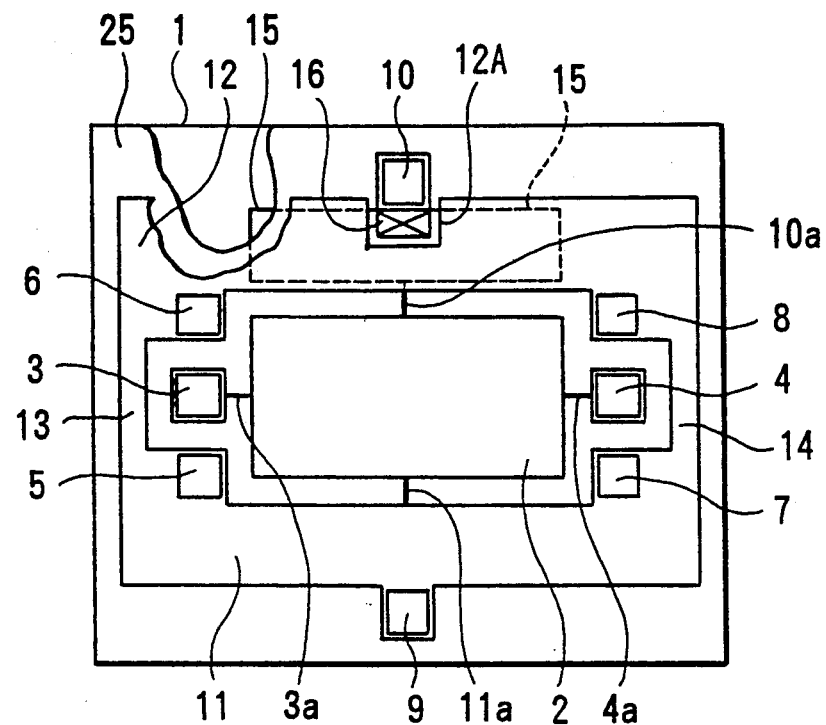
FIG. 1a is a plan view showing a chip layout of a semiconductor integrated circuit device according to the first embodiment of the present invention.

FIG. 1a shows a chip layout according to the first embodiment of the present invention. Referring to FIG. 1a, reference numeral 1 denotes a semiconductor substrate; 2, an internal circuit formed in a predetermined region of the semiconductor substrate 1; 3 and 4, input and output signal pads connected to the internal circuit 2 through lines 3a and 4a, respectively; 5, 6, 7, 8, and 9, ground pads, respectively; and 10, a power source pad. The pads 3 to 10 are arranged on the surface of the semiconductor substrate 1. The ground pads 5 and 7 are connected to each other by a first ground pattern 11, and the ground pads 6 and 8 are connected to each other by a second ground pattern 12 having a notch 12A. The two ends of the first ground pattern 11 are connected to the two ends of the second ground pattern 12 by third and fourth ground patterns 13 and 14. Therefore, the first to fourth ground patterns 11 to 14 are arranged so as to surround the region in which the internal circuit 2 is formed, and connected to the internal circuit 2 through a line 11a.

In this case, a power source pattern 15 is formed below the second ground pattern 12. Between the power source pattern 15 and the second ground pattern, an insulating interlayer 25 is interposed. The insulating interlayer 25 is made of a dielectric material such as $SiO_2$ and $Si_3N_4$, etc. The second ground pattern 12, the insulating interlayer 25, and the power source pattern 15 constitute an MIM capacitor. The power source pad 10 is electrically connected to the power source pattern 15 by a through hole 16 passing through the notch 12A. In addition, the power source pad 10 is connected to the internal circuit 2 through the power source pattern 15 and line 10a.

The input signal pad 3 and the ground pads 5 and 6 constitute a coplanar input pad array, and the output signal pad 4 and the ground pads 7 and 8 constitute a coplanar output pad array.

Figure 1B:
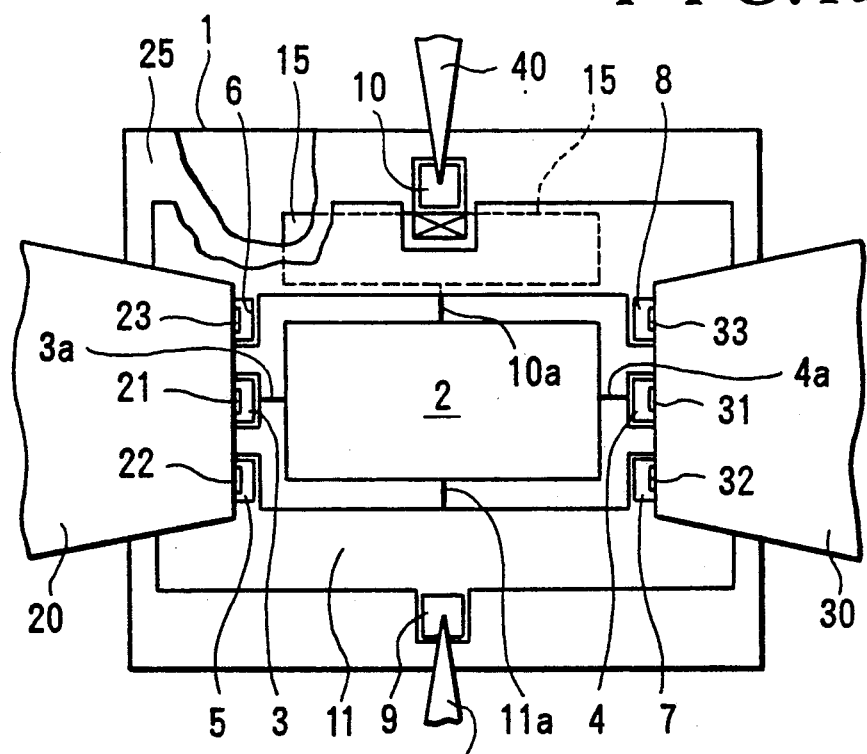
FIG. 1b is a plan view showing a state wherein the RF characteristic of the semiconductor integrated circuit device of the first embodiment is measured.

FIG. 1b shows a state wherein a characteristic test is performed to the semiconductor integrated circuit device. Probe electrodes 21 to 23 of an RF probe 20 are brought into contact with the input pad array, and probe electrodes 31 to 33 of an RF probe 30 are brought into contact with the output pad array. DC probes 40 and 50 are brought into contact with the electrode pad 10 and the ground pad 9, respectively.

With the above arrangement, since the internal circuit 2 is connected to the power source pad 10 through the power source pattern 15 and the line 10a, when the DC probe 40 is connected to the power source pad 10, the power source pad 10 can be RF-grounded by the MIM capacitor constituted by the power source pattern 15, the insulating interlayer 25, and the second ground pattern 12. Therefore, the power source pad 10 need not be RF-grounded using a chip capacitor or the like on a probe card having a probe. According to this embodiment, an RF characteristic can be measured in wafer state with precision higher than that obtained when the power source pad 10 is RF-grounded on the probe card.

The capacitance of the MIM capacitor is properly set within a range of several pF to several tens pF. When an MIM capacitor having a capacitance of about 1 fF/$\mu$m$^2$ is used, the MIM capacitor occupies an area of several thousands $\mu$m$^2$ to several ten thousands $\mu$m$^2$ on the chip. This value can be permitted.

Figure 2A:
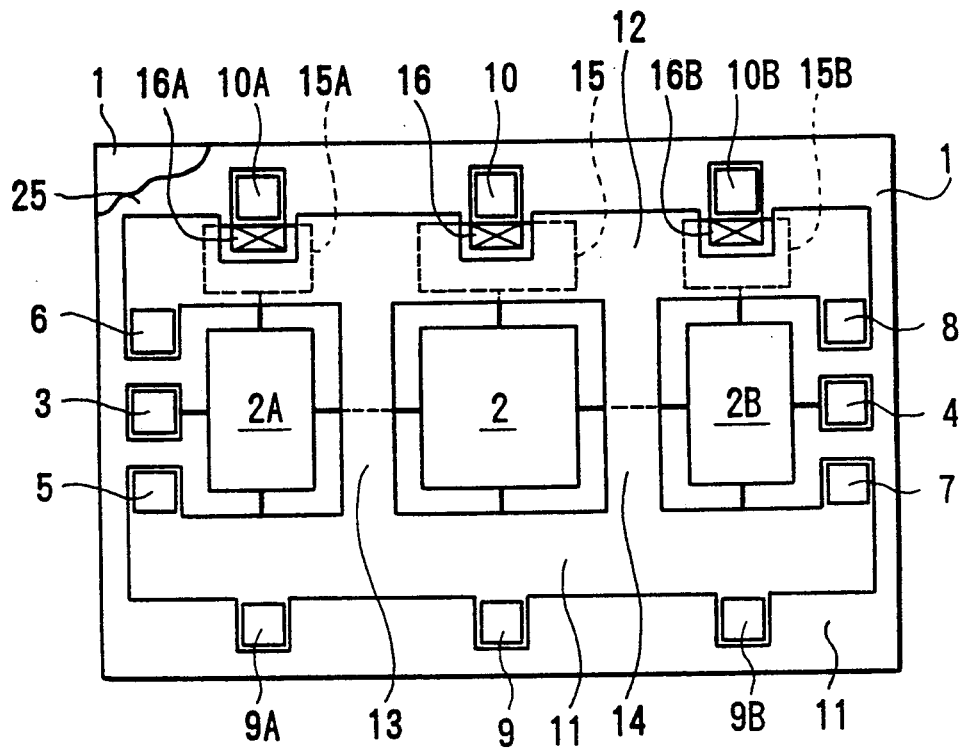
FIG. 2a is a plan view showing a chip layout of a semiconductor integrated circuit device according to the second embodiment of the present invention.

FIG. 2a is a view showing a chip layout according to the second embodiment of the present invention. The same reference numerals as in FIG. 1a denote the same parts in FIG. 2a. In FIG. 2a, internal circuits 2A and 2B are arranged, and the internal circuits 2A, 2, and 2B are cascade-connected to each other. In addition, power source patterns 15A and 15B connected to the internal circuits 2A and 2B and power source pads 10A and 10B connected to the power source patterns 15A and 15B through via-holes 16A and 16B are arranged, respectively.

In this embodiment, the power source patterns 15, 15A, and 15B respectively connected to the power source pads 10, 10A, and 10B constitute MIM capacitors by cooperating with using a second ground pattern 12 and an insulating interlayer 25, respectively. RF grounding is performed by each MIM capacitor formed in each power source pad.

Note that reference numerals 9A and 9B denote ground pads.

Figure 2B:
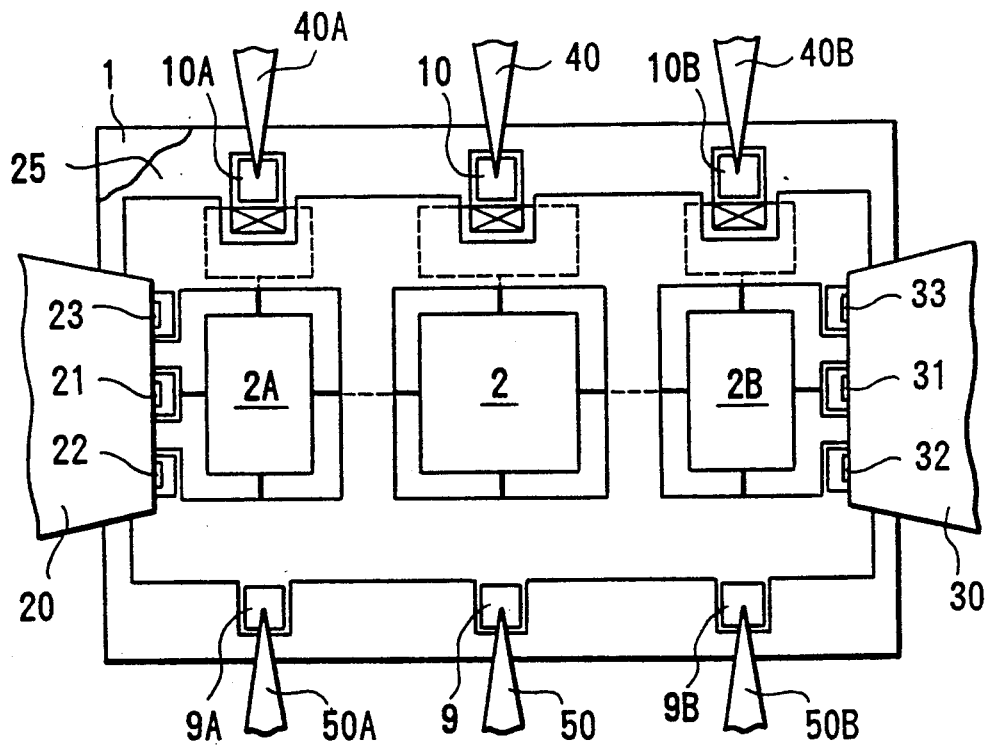
FIG. 2b is a plan view showing a state wherein the RF characteristic of the semiconductor integrated circuit device of the second embodiment is measured.

FIG. 2b shows a state wherein an RF characteristic test is performed to the semiconductor integrated circuit device. Probes are brought into contact with the pads to measure the characteristics of the semiconductor integrated circuit device. In this case, when DC probes 40, 40A, and 40B are brought into contact with the power source pads 10, 10A, and 10B, respectively, the power sources are RF-grounded by the MIM capacitors arranged on the chip. Thus, the RF characteristic can be precisely measured in a wafer state by a single step.

Note that reference numerals 50A and 50B denote DC probes.

Figure 3A:
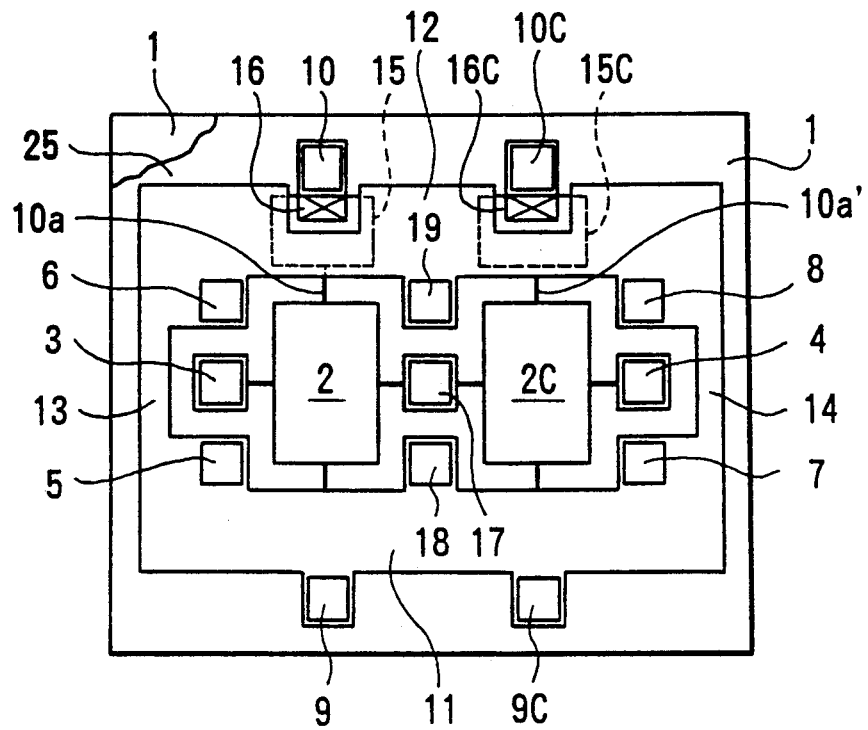
FIG. 3a is a plan view showing a chip layout of a semiconductor integrated circuit device according to the third embodiment of the present invention.

FIG. 3a shows a chip layout according to the third embodiment of the present invention. The same reference numerals as in FIG. 1a denote the same parts in FIG. 3a.

In this embodiment, an inter-stage signal pad 17 and ground pads 18 and 19 are arranged between an internal circuit 2 and an internal circuit 2C cascade-connected to the internal circuit 2, and these pads constitute an inter-stage pad array. The internal circuits 2 and 2C electrically connect power source patterns 15 and 15C arranged below a second ground pattern 12 to power source pads 10 and 10C through via-holes 16 and 16C and lines 10a and 10a', respectively.

Figure 3B:
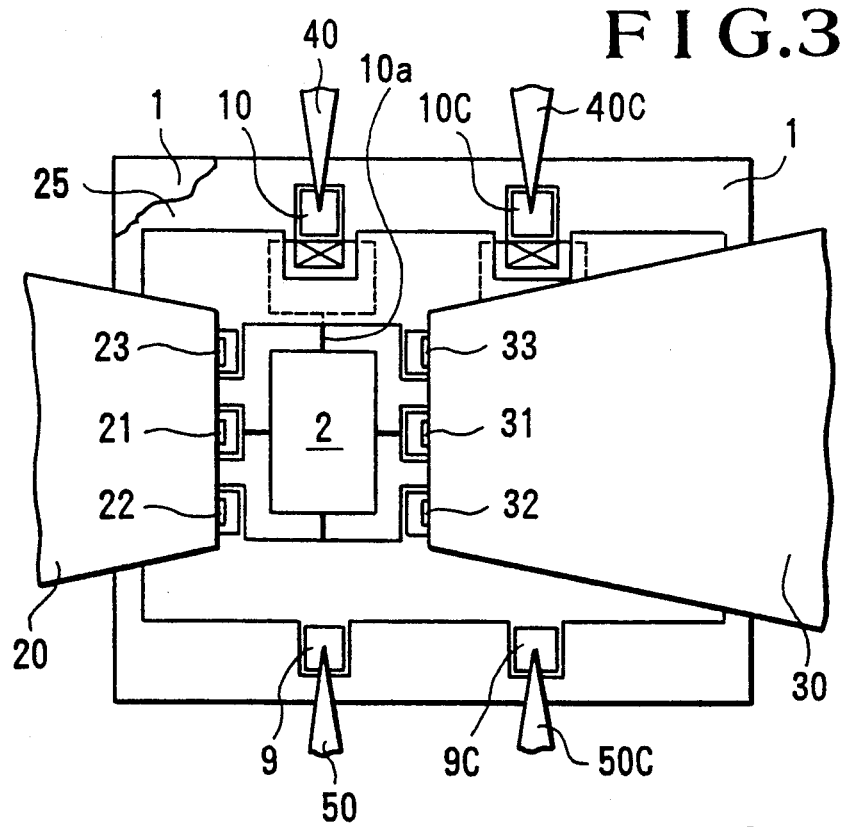
FIG. 3b is a plan view showing a state wherein the RF characteristic of the semiconductor integrated circuit device of the third embodiment is measured.
Figure 4A:
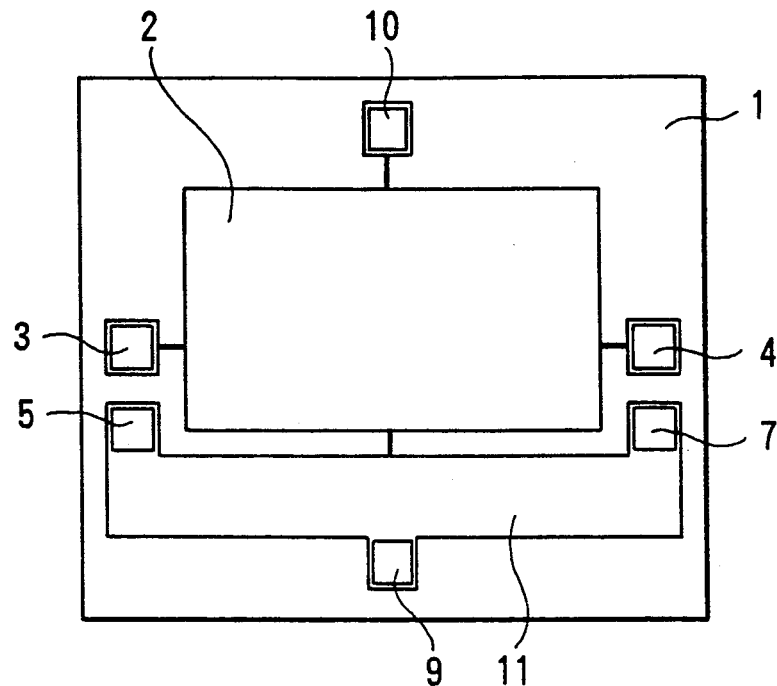
FIG. 4a is a plan view showing a chip layout of a conventional semiconductor integrated circuit device.
Figure 4B:
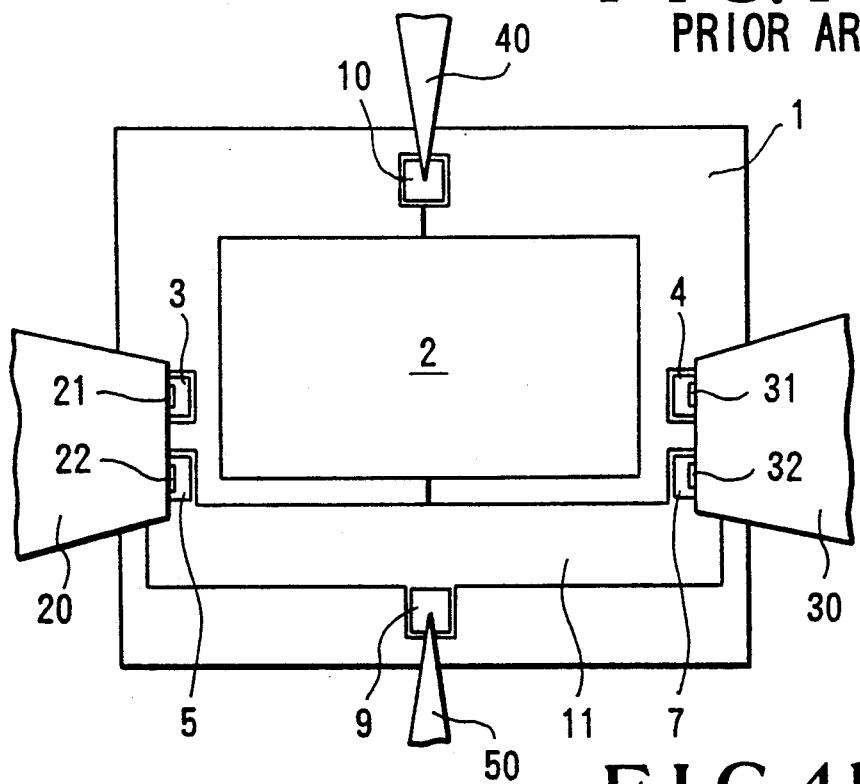
FIG. 4b is a plan view showing a state wherein the RF characteristic of the conventional semiconductor integrated circuit device is measured.

In the semiconductor integrated circuit device, upon a high-frequency characteristic test, as shown in FIG. 3b, RF brobes 20 and 30 are brought into contact with the input pad array and the inter-stage pad array, respectively. DC probes 40, 40C, 50, and 50C are brought into contact with the power source pads 10 and 10C and ground pads 9 and 9C, thereby performing a characteristic test to the internal circuit 2 serving as an input stage circuit.

Although not shown, the RF probes 20 and 30 are connected to the inter-stage pad array and the output pad array, respectively, thereby performing a characteristic test to the internal circuit 2C serving as an output stage circuit.

Upon these characteristic tests, since RF grounding is performed in each of the power source pads 10 and 10C by the MIM capacitors, RF characteristics of the circuits 2 and 2C can be sequentially measured with high precision in a wafer state.

As described above, according to the present invention, a power source pattern constituting an MIM capacitor with a ground pattern is arranged in an internal circuit, and the power source pattern is electrically connected to the power source pad. Therefore, the power source pad can be RF-grounded by the MIM capacitor, and a RF-ground circuit need not be arranged on a probe card. In addition, the RF characteristic of a semiconductor integrated circuit device can be precisely measured in a wafer state.

What is claimed is:

1. A semiconductor integrated circuit device comprising:
   a semiconductor substrate;
   an internal circuit formed on said semiconductor substrate in a predetermined region of the circuit device;
   input and output signal pads arranged on a semiconductor substrate surface and connected to said internal circuit;
   a power source pad and a plurality of ground pads, arranged on said semiconductor substrate surface, for supplying a power source to said internal circuit;
   a ground pattern, arranged in a region of the of the circuit device different from said region in which said internal circuit is formed, for connecting said plurality of ground pads to each other;
   a power source pattern formed on said substrate below said ground pattern and connected to said power source pad to connect said power source pad to said internal circuit; and
   an insulating interlayer positioned below said ground pattern and above said power source pattern so as to cover and separate said power source pattern from said ground pattern;
   said ground patter, said insulating interlayer, and said power source pattern forming an MIM capacitor.

2. A device according to claim 1, wherein said plurality of ground pads include first ground pads and second ground pads and wherein an input pad and said first ground pads constitute a coplanar input pad array arranged in a row including a ground pad, the input pad and another ground pad.

3. A device according to claim 2, wherein an output pad and said second ground pads constitute a coplanar output pad array arranged in a row including a ground pad, the output pad and a further ground pad.

4. A device according to claim 1, wherein said ground pattern has a notch.

5. A device according to claim 4, wherein said power source pattern and said power source pad are connected to each other through a via-hole passing through said notch.

6. A device according to claim 1, wherein said ground pattern is arranged to surround the region in which said internal circuit is formed.

7. A semiconductor integrated circuit device comprising:
a semiconductor substrate;
a plurality of internal circuits independently formed in a predetermined region of said semiconductor substrate so as to be cascade-connected to each other;
input and output signal pads arranged on a surface of said semiconductor substrate and connected to an input and an output of said cascade-connected internal circuits, respectively;
a plurality of power source pads and a plurality of ground pads arranged on the surface of said semiconductor substrate, for respectively supplying powers to said internal circuits;
a common ground pattern arranged in a region of the surface of said semiconductor substrate different from the region in which said internal circuits are formed, for connecting said plurality of ground pads to each other; and
a plurality of power source patterns formed on said substrate below said ground pattern and separated therefrom through an insulating interlayer and respectively connected to said internal circuits and said power source pads.

8. A device according to claim 7, further comprising a inter-stage signal pad arranged between an output terminal and an input terminal of each two neighboring internal circuits connected to each other.

* * * * *